(12) United States Patent
Zhou et al.

(10) Patent No.: US 8,802,812 B2
(45) Date of Patent: Aug. 12, 2014

(54) PHOTOVOLTAIC POLYMER MATERIAL, PREPARATION METHOD AND USE THEREOF

(75) Inventors: Mingjie Zhou, Shenzhen (CN); Ping Wang, Shenzhen (CN); Zhenhua Zhang, Shenzhen (CN); Lusheng Liang, Shenzhen (CN)

(73) Assignee: Ocean's King Lighting Science & Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 13/992,166

(22) PCT Filed: Dec. 30, 2010

(86) PCT No.: PCT/CN2010/080532
§ 371 (c)(1),
(2), (4) Date: Jun. 6, 2013

(87) PCT Pub. No.: WO2012/088698
PCT Pub. Date: Jul. 5, 2012

(65) Prior Publication Data
US 2013/0267657 A1    Oct. 10, 2013

(51) Int. Cl.
*C08G 75/00*    (2006.01)
*H01L 51/00*    (2006.01)
*C08G 61/12*    (2006.01)
*H01L 31/0256*  (2006.01)
*H01L 51/42*    (2006.01)

(52) U.S. Cl.
CPC ........ H01L 31/0256 (2013.01); H01L 51/0036 (2013.01); *C08G 2261/3241* (2013.01); *Y02E 10/549* (2013.01); H01L 51/0043 (2013.01); *C08G 2261/3243* (2013.01); *C08G 2261/91* (2013.01); *C08G 61/126* (2013.01); *C08G 61/123* (2013.01); *H01L 51/4253* (2013.01); *C08G 2261/344* (2013.01); *C08G 2261/3246* (2013.01)
USPC ............................ 528/378; 528/377; 528/380

(58) Field of Classification Search
CPC ................................................ C08G 2261/3243
USPC ........................................ 528/377, 378, 380
See application file for complete search history.

(56) References Cited

FOREIGN PATENT DOCUMENTS

| | | |
|---|---|---|
| JP | 2006-045398 A | 2/2006 |
| JP | 2009-155648 A | 7/2009 |
| JP | 2009-209134 A | 9/2009 |
| JP | 2010-144162 A | 7/2010 |
| JP | 2012-500308 A | 1/2012 |
| JP | 2013-534949 A | 9/2013 |
| WO | 2010/020329 A | 2/2010 |

OTHER PUBLICATIONS

Bouffard et al. Macromolecules 2008, 41, 5559-5562.*
Chao-Ying Yu, et al., Thiophene/Phenylene/Thiophene-Based Low-Bandgap Conjugated Polymers for Efficient Near-Infrared Photovoltaic Applications, Chemistry of Materials, 2009, 21(14), p. 3262-3269.

* cited by examiner

*Primary Examiner* — Shane Fang
(74) *Attorney, Agent, or Firm* — Shimokaji & Associates P.C.

(57) ABSTRACT

A photovoltaic polymer material, preparation method and use thereof are provided. Said photovoltaic polymer material has the following formula (I). The photovoltaic polymer material has the thiophene-phenylene-thiophene (TPT) derivative as the basic structure unit, and by the introduction of $D_1$ and $D_2$ structures to modify the TPT, and the photovoltaic polymer material has the characters of higher hole mobility, narrower band gap and broader absorption region.

4 Claims, 1 Drawing Sheet

PHOTOVOLTAIC POLYMER MATERIAL, PREPARATION METHOD AND USE THEREOF

FIELD OF THE INVENTION

The present invention relates to the technical field of organic material, more particularly to a photovoltaic polymer material, preparation method and use thereof.

BACKGROUND OF THE INVENTION

The researches on organic solar cell began in 1959. It has a structure of monocrystalline anthracene sandwiched between two cells, the open-circuit voltage of the device is 200 mV, but the photoelectric conversion efficiency is very low. Dr. Deng Qingyun reported a solar cell with double-layered structure in 1986 (taking phthalocyanine derivative as p-type semiconductor, taking perylene tetracarboxylic derivative as n-type semiconductor to form double-layered heterojunction structure, photoelectric conversion efficiency was about 1%), creating a new era of organic solar cell research. This study firstly introduced the concept of electron donor (p-type)/electron acceptor (n-type) organic double-layered heterojunction into solar cell, and explained the reason for high efficiency of cell is that induced dissociation efficiency of light-induced excitons at the double-layered heterojunction interface is relatively high.

In 1992, Heeger. A J and Yoshino K. found that under the light-induced conditions, rapid charge transfer occurred in the blended system taking conjugated photovoltaic polymer material as electron donor (Donor, abbr. D) and taking C60 as electron acceptor (Acceptor, abbr. A), and the rate of this process was far greater than the reverse process. The reason is that C60 is a large conjugated system, the electrons in the molecular orbital composed of 60 carbon atoms are in the delocalized state and therefore steadying external electrons. These findings make researches on photovoltaic polymer material solar cell become a new hotspot.

Heeger A. J. prepared bulk heterojunction solar cell by taking blended material system as active layer, which comprises photovoltaic polymer material MEH-PPV served as donor, C60 derivative PCBM served as acceptor. The photoelectric conversion efficiency of the cell was further enhanced due to a great expansion of the interface between donor and acceptor, and an improvement of dissociation efficiency of excitons. In the monochromatic light at 20 mW/cm$^2$ and 430 nm, energy conversion efficiency reached 2.9%.

In order to further improve the energy conversion efficiency of the photovoltaic polymer material solar cell, it is crucially important to develop a new semiconductor photovoltaic polymer material with a narrow band gap and broad absorption region. The photovoltaic polymer material with narrow band gap in the prior art usually shows better absorption in the longwave range (for example, near-infrared), while shows weak absorption in partial visible region. In addition, photovoltaic polymeric material with narrow band gap has disadvantages of relatively low hole mobility and poor solubility. In recent years, Wong et al (Org. Lett. 2006, 8, 5033) have synthesized a novel coplanar chromophore thiophene-phenylene-thiophene (TPT) derivative, and reported that photovoltaic polymer material containing TPT had superior performances on hole mobility, band gap, high absorption coefficient and wide absorption range to the sunlight, however, hole mobility, band gap and absorption range of the TPT photovoltaic polymer material are not superior enough, and need further improvements.

SUMMARY OF THE INVENTION

In view of this, the purpose of the embodiment of the present invention is to provide a photovoltaic polymer material having higher hole mobility, narrower band gap and broader absorption region; another purpose of the embodiment of the present invention is to provide a preparation method of photovoltaic polymer material; the embodiment of the present invention further provides use of the above photovoltaic polymer material in organic optoelectronic material, organic solar cell device, organic field effect transistor device, organic electroluminescence device, organic optical storage device and organic laser device.

The present invention can be implemented in such a way that:

A photovoltaic polymer material, having the following structural formula:

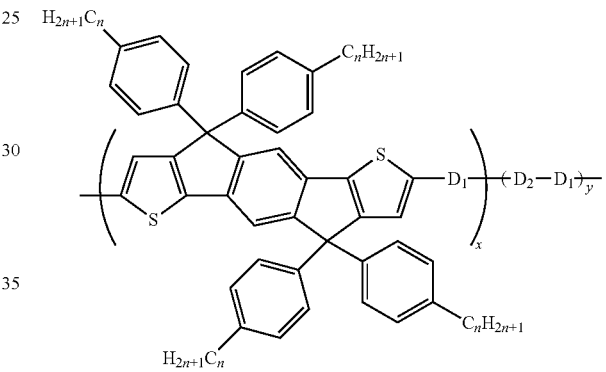

wherein $D_1$ is one selected from the following structures:

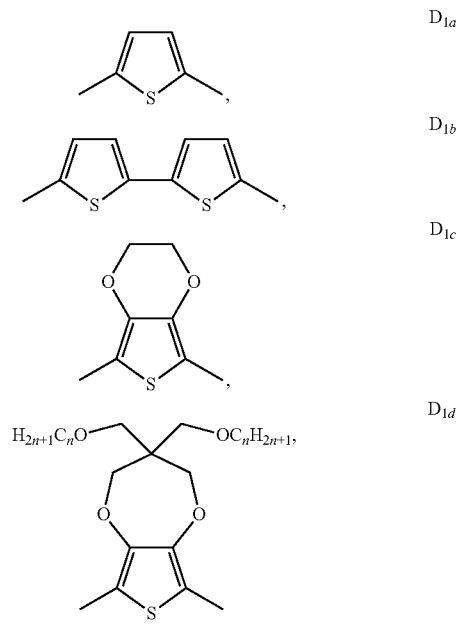

-continued

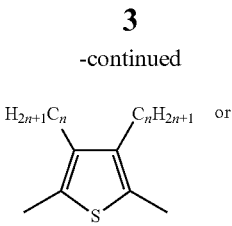 or

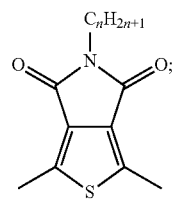

$D_2$ is one selected from the following structures:

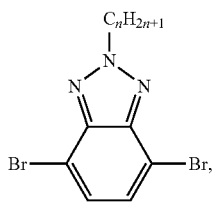

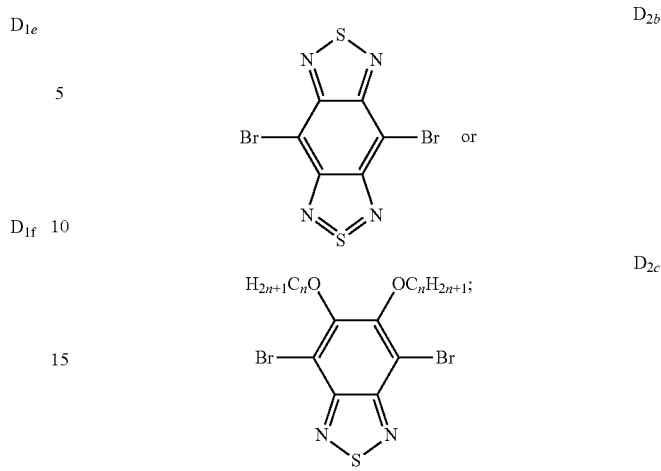

n is an arbitrary natural number from 6 to 20, x is an arbitrary natural number from 1 to 50, y is an arbitrary natural number from 1 to 50, $2 \leq x+y \leq 100$.

And, a preparation method of photovoltaic polymer material, comprising:

providing monomer M, monomer $D_1$ and monomer $D_2$ separately;

in oxygen-free environment, dissolving the monomer M, monomer $D_1$ and monomer $D_2$ in solvent, carrying out Stille reaction for from 20 minutes to 2 hours at a temperature in the range of from 90° C. to 110° C. and in the presence of catalyst, then obtaining photovoltaic polymer material, the equation can be expressed as:

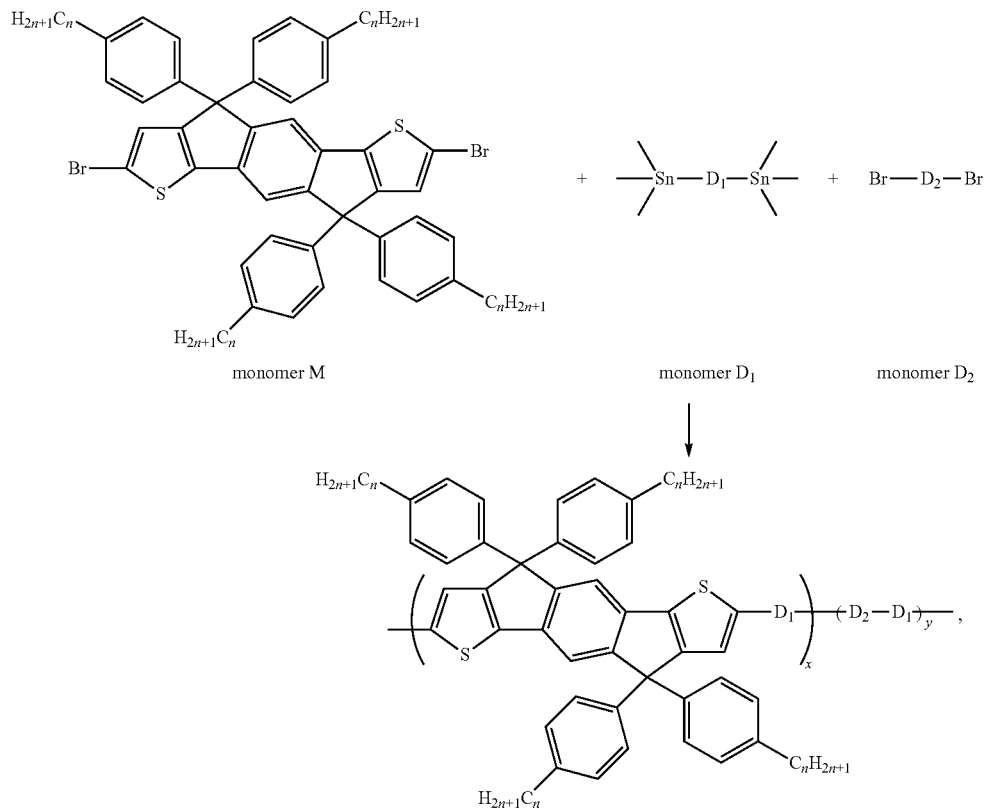

wherein, monomer $D_1$ is one of the following monomers:

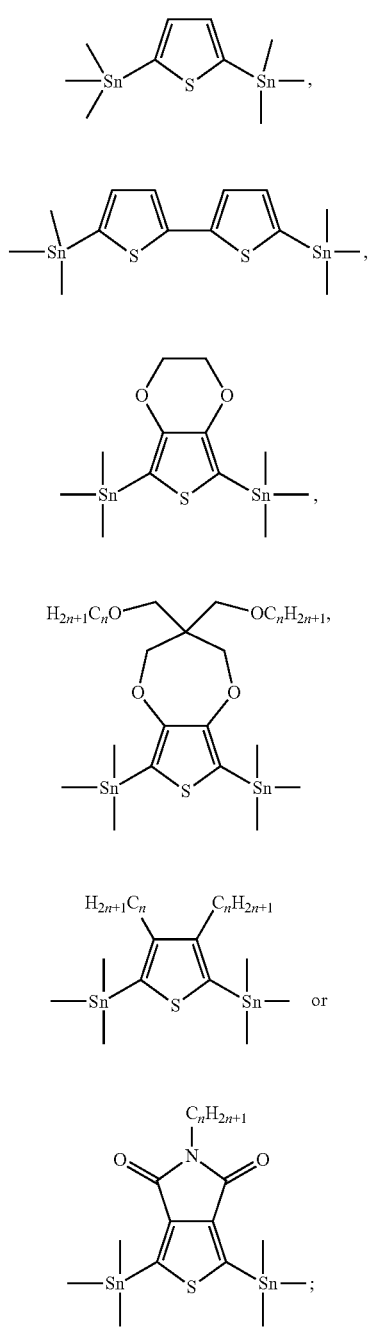

$D_2$ is one of the following structures:

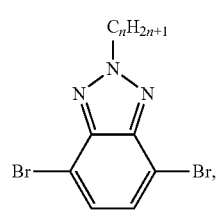

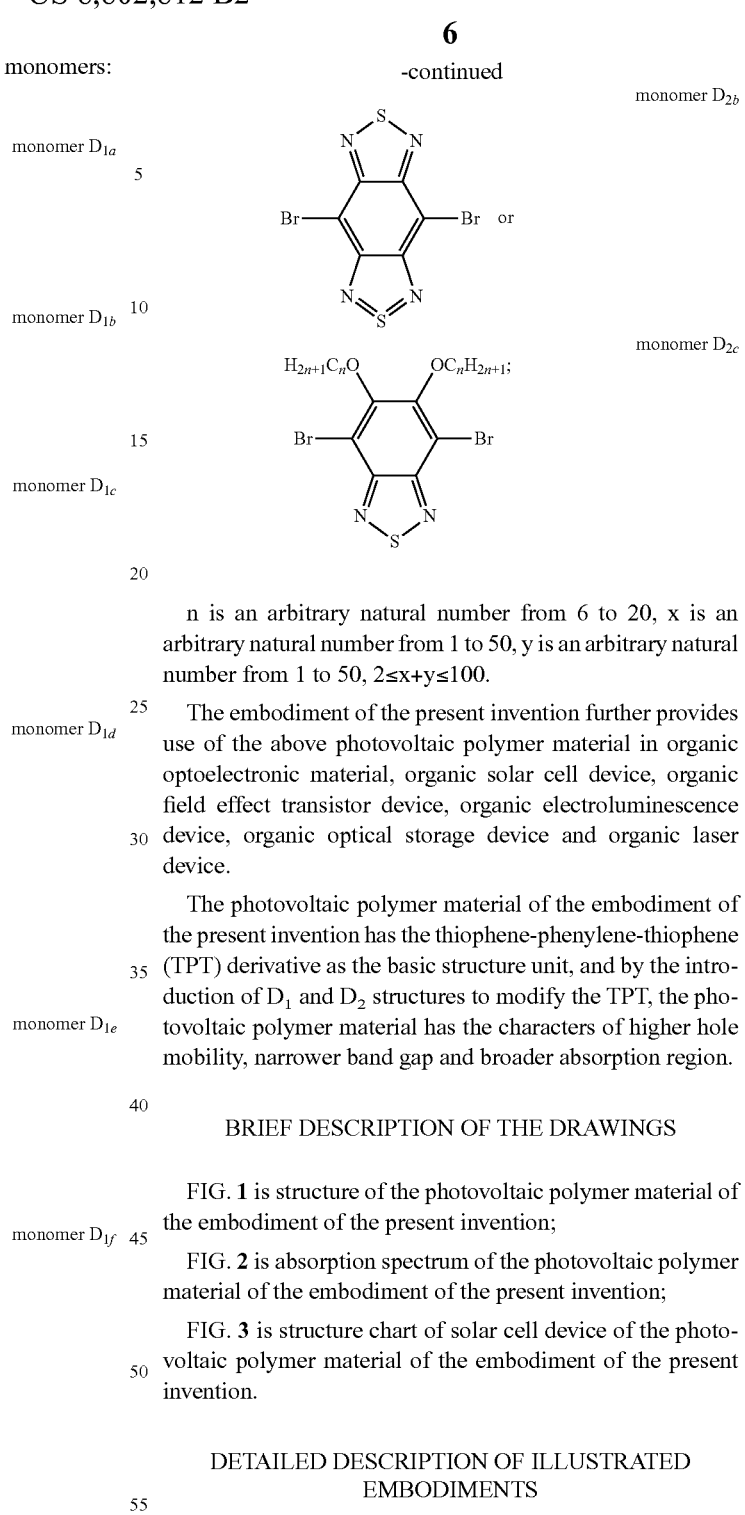

n is an arbitrary natural number from 6 to 20, x is an arbitrary natural number from 1 to 50, y is an arbitrary natural number from 1 to 50, $2 \leq x+y \leq 100$.

The embodiment of the present invention further provides use of the above photovoltaic polymer material in organic optoelectronic material, organic solar cell device, organic field effect transistor device, organic electroluminescence device, organic optical storage device and organic laser device.

The photovoltaic polymer material of the embodiment of the present invention has the thiophene-phenylene-thiophene (TPT) derivative as the basic structure unit, and by the introduction of $D_1$ and $D_2$ structures to modify the TPT, the photovoltaic polymer material has the characters of higher hole mobility, narrower band gap and broader absorption region.

DETAILED DESCRIPTION OF ILLUSTRATED EMBODIMENTS

Figure 1:
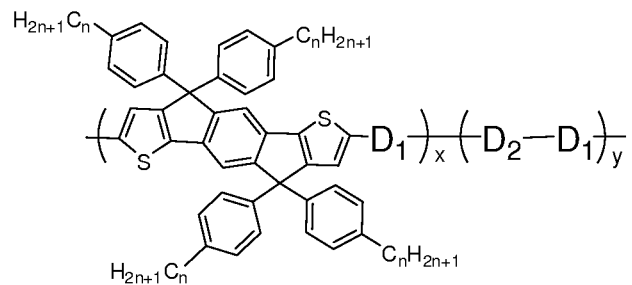
FIG. 1 is structure of the photovoltaic polymer material of the embodiment of the present invention.

Further description of the present invention will be illustrated, which combined with embodiments in the drawings, in order to make the purpose, the technical solution and the advantages clearer. While the present invention has been described with reference to particular embodiments, it will be understood that the embodiments are illustrative and that the invention scope is not so limited.

Referring to FIG. 1, FIG. 1 shows structure of the photovoltaic polymer material of the embodiment of the present invention:

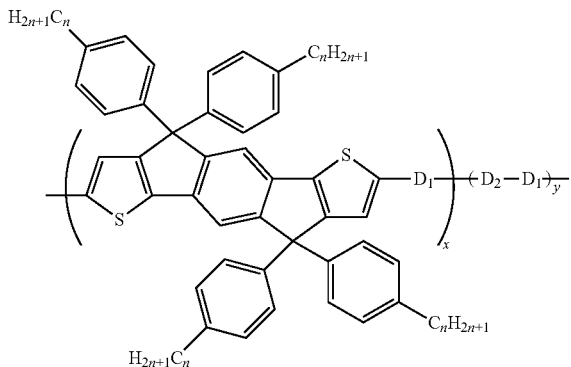

wherein $D_1$ is one selected from the following structures:

$D_{1a}$ $D_{1b}$ $D_{1c}$ $D_{1d}$ $D_{1e}$ or $D_{1f}$ $D_2$ is one selected from the following structures:

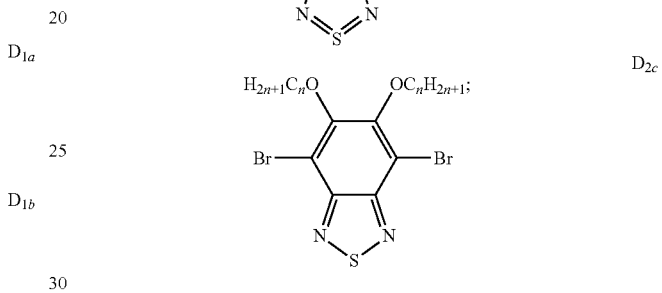

$D_{2a}$ $D_{2b}$ or $D_{2c}$ n is an arbitrary natural number from 6 to 20, x is an arbitrary natural number from 1 to 50, y is an arbitrary natural number from 1 to 50, 2≤x+y≤100.

Furthermore, n is an arbitrary natural number from 6 to 12, x is an arbitrary natural number from 2 to 40, y is an arbitrary natural number from 2 to 40, 4≤x+y≤80.

Furthermore, number-average molar mass of photovoltaic polymer material of the embodiment of the present invention is in the range of from 29100 to 40000, molecular weight distribution is in the range of from 1.9 to 2.5.

The photovoltaic polymer material of the embodiment of the present invention has the thiophene-phenylene-thiophene (TPT) derivative as the basic structure unit, and by the introduction of $D_1$ and $D_2$ structures to modify the TPT, the photovoltaic polymer material has the characters of higher hole mobility, narrower band gap and broader absorption region.

Figure 2:
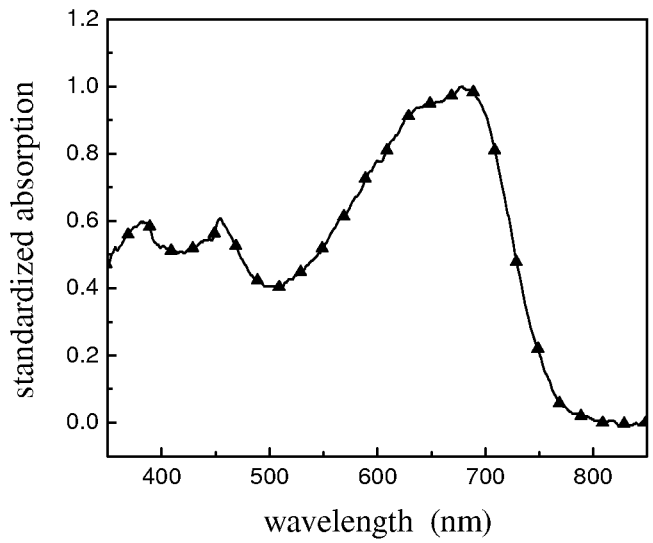
FIG. 2 is absorption spectrum of the photovoltaic polymer material of the embodiment of the present invention.

Referring to FIG. 2, FIG. 2 shows absorption spectrum of the copolymer of the embodiment of the present invention, it can be seen from FIG. 2 that the copolymer of the embodiment of the present invention has broader absorption region.

The embodiment of the present invention further provides a preparation method of photovoltaic polymer material, comprising:

providing monomer M, monomer $D_1$ and monomer $D_2$ separately;

in oxygen-free environment, dissolving the monomer M, monomer $D_1$ and monomer $D_2$ in solvent, carrying out stille reaction for from 20 minutes to 2 hours at a temperature in the range of from 90° C. to 110° C. and in the presence of catalyst, then obtaining photovoltaic polymer material, the equation is expressed as:

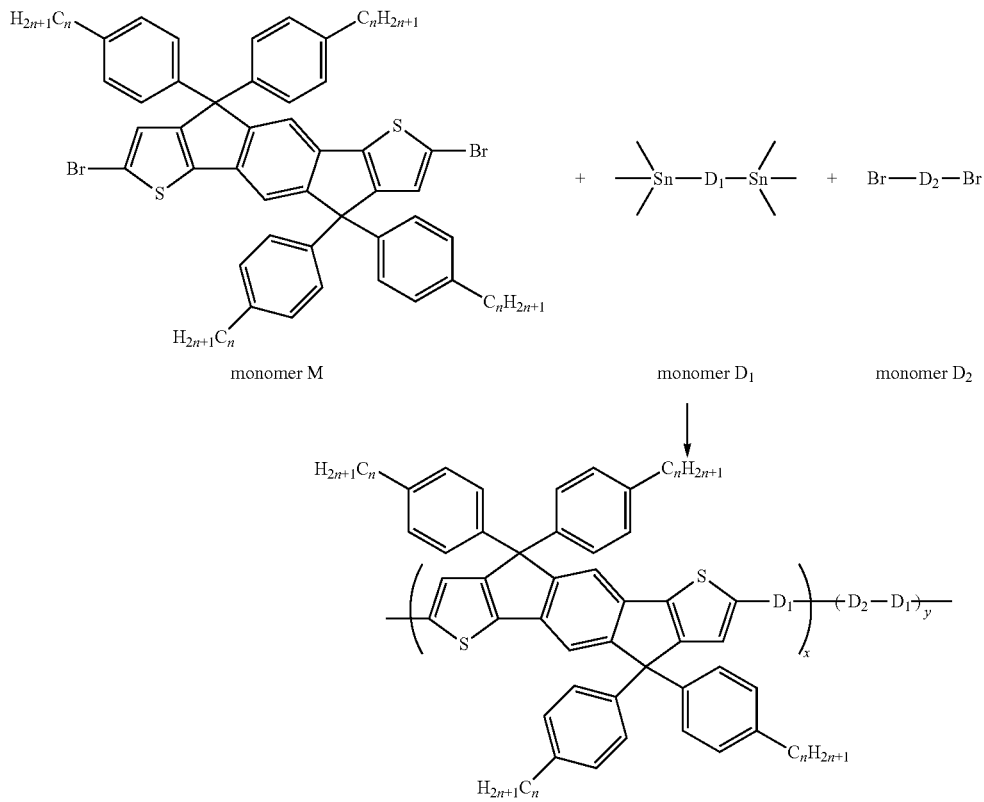
monomer M        monomer $D_1$        monomer $D_2$
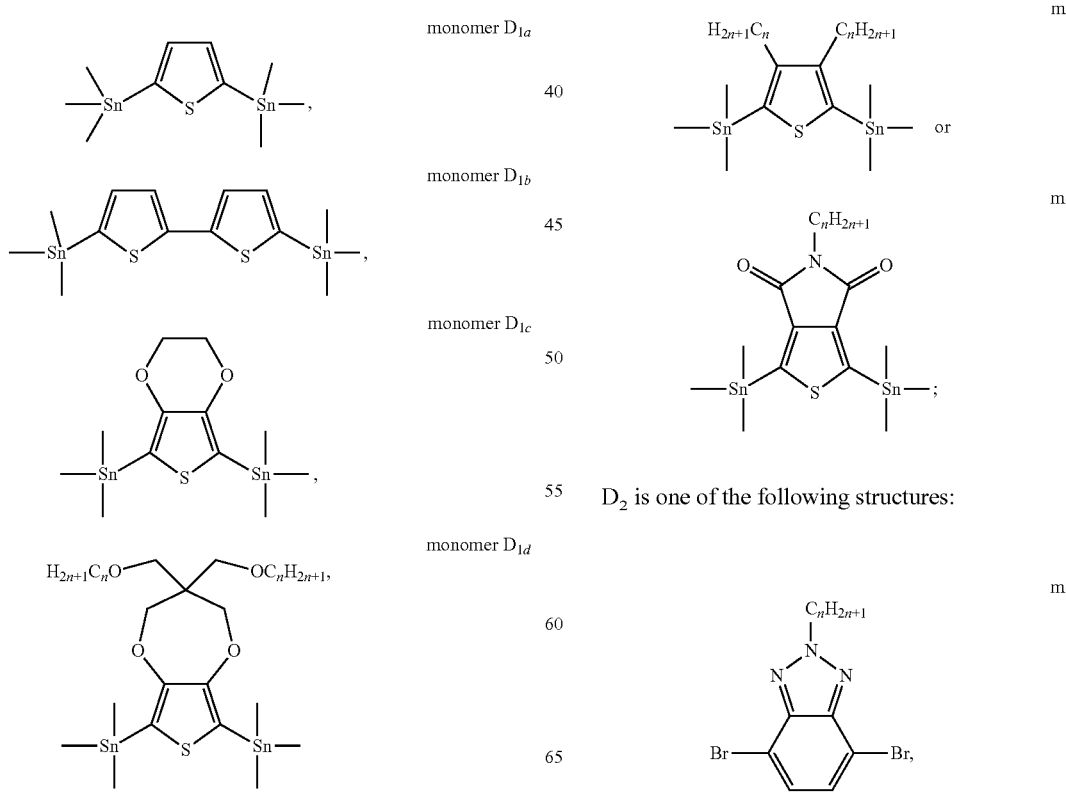
wherein, monomer $D_1$ is one of the following monomers:
monomer $D_{1a}$
monomer $D_{1b}$
monomer $D_{1c}$
monomer $D_{1d}$
-continued
monomer $D_{1e}$
monomer $D_{1f}$
$D_2$ is one of the following structures:
monomer $D_{2a}$
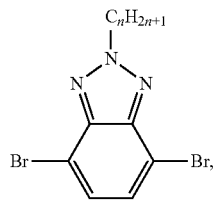

-continued

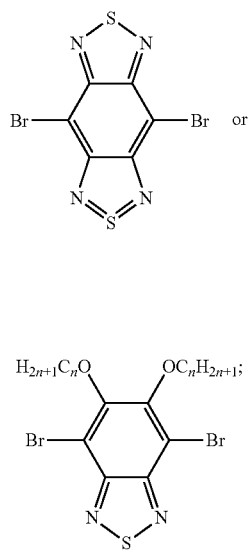

monomer $D_{2b}$ monomer $D_{2c}$ n is an arbitrary natural number from 6 to 20, x is an arbitrary natural number from 1 to 100, y is an arbitrary natural number from 1 to 100.

Specifically, the solvent is not limited, can be the solvent commonly used in Stille reaction, such as one or more of chloroform, methylbenzene, tetrahydrofuran, glycol dimethyl ether, dioxane, N,N-dimethyl formamide, chlorobenzene and benzene. The monomer M is dibromo monomers containing (thiophene-phenylene-thiophene) or their derivatives, monomer $D_1$ is thienyl di stannum monomers or their derivatives, monomer $D_2$ is triazolyl dibromo monomers or their derivatives, molar ratio of the monomer M, monomer $D_1$ and monomer $D_2$ is 1-2:4-6:1-2, preferably 1:2:1. The catalyst is organopalladium or mixture of organopalladium and organic phosphorus ligand in molar ratio of 1:1~20, such as $Pd_2(dba)_3/P(o\text{-}Tol)_3$, $Pd(PPh_3)_4$, $Pd(PPh_3)_2Cl_2$, tris(dibenzylideneacetone)dipalladium, tris(o-methylphenyl)phosphine, bis(triphenylphosphine)palladium(II) dichloride, molar ratio of the catalyst to monomer M is 1-80-120.

The oxygen-free environment includes any conditions without oxygen, such as 100% nitrogen, argon, and other environments. The oxygen-free environment can be obtained by various methods, but preferred is to evacuate by oil pump then supply nitrogen, which is repeated for 3~4 times, then supply continuously nitrogen to make the reaction system under the protection of nitrogen, maintain the protection of nitrogen while adding reactants into the reaction system.

Specifically, the preparation method of the embodiment of the present invention further comprises preparation of monomer M, preparation of monomer $D_1$ and preparation of monomer $D_2$:

Preparation of monomer M will be illustrated below by taking the preparation of monomer $M_1$ (dibromo TPT) as example:

Monomer M, where n is 6, being monomer $M_1$:

Monomer $M_1$ is prepared according to the method disclosed in Macromolecules 2008, 41, 5519.

Step i):

Under conditions of ice-bath, 2-bromothiophene (2.8 mL, 28.8 mmol) and magnesium granules (702 mg, 28.8 mmol) are added into THF solution (30 mL), followed by adding stepwise zinc chloride solution (3.9 g), then stirring for 30 min. Mixed solution is obtained and ice-bath is removed. 2,5-dibromo-1,4-diethyl terephthalate (4.38 g, 11.5 mmol) and tetrakis(triphenylphosphine)palladium (266 mg, 2 mol %) are then added into the mixed solution, the refluxing reaction is held for 12 hours then stopped. After filtration, extraction with ethyl acetate, rotary evaporation to remove solvent, raw product is separated by being subjected to silica gel chromatography column using eluent (ethyl acetate/n-hexane=1/9) to obtain bright yellow liquid (that is, intermediate product 1) (56% yield). mp 103~104° C., HNMR (CDCl3, 400 MHz) δ7.81 (s, 2H), 7.39 (dd, J=4.8, 1.2 Hz, 2H), 7.08 (m, 4H), 4.22 (q, J=7.2 Hz, 4H), 1.16 (t, J=7.2 Hz, 6H).

Step ii):

The intermediate product 1 (3.2 g, 8.3 mmol) is dissolved in tetrahydrofuran (20 mL), followed by adding drop wise 4-n-hexylphenylmagnesium bromide (prepared by reaction of 1-bromo-4-n-hexylbenzene (10.2 mL, 50 mmol) with magnesium granules (1.2 g, 50 mmol)). The refluxing reaction is held for 13 hours then stopped. After extraction with ethyl acetate, drying with anhydrous magnesium sulfate, rotary evaporation to remove solvent, intermediate product is obtained. The intermediate product is then dissolved in mixed solution of acetic acid (100 mL) and sulfuric acid (5 mL). The refluxing reaction is held for 4 hours then stopped and cooled. After extraction with ethyl acetate, drying with anhydrous magnesium sulfate, rotary evaporation to remove solvent, raw product is obtained which is then subjected to silica gel chromatography column using n-hexane as eluent to obtain yellow solid (that is, intermediate product 2) (42% yield).

H NMR (CDCl$_3$, 400 MHz) δ 7.42 (s, 2H), 7.23 (d, J) 4.8 Hz, 2H), 7.09 (dd, J) 14.0, 8.0 Hz, 16H), 6.99 (d, J) 5.2 Hz, 2H), 2.54 (t, J) 8.0 Hz, 8H), 1.76 (m, 8H), 1.27-1.29 (m, 24H), 0.87 (t, J) 6.6 Hz, 12H).

Step iii):

The intermediate product 2 (907 mg, 1 mmol) and N-bromosuccinimide (392 mg, 2.2 mmol) are dissolved in 30 mL of chloroform, then react for 12 hours in the dark, then stopped. After extraction with chloroform, washing with saturated solution of sodium chloride, then drying with anhydrous magnesium sulfate, raw product is recrystallized with methanol to obtain bright yellow product, that is, $M_1$ (92%).

H NMR (CDCl$_3$, 400 MHz) δ 7.32 (s, 2H), 7.07-7.09 (m, 16H), 6.99 (s, 2H), 2.56 (t, J) 8.0 Hz, 8H), 1.57 (m, 8H), 1.29 (m, 24H), 0.87 (t, J) 6.6 Hz, 12H).

The equation for the preparation is expressed as:

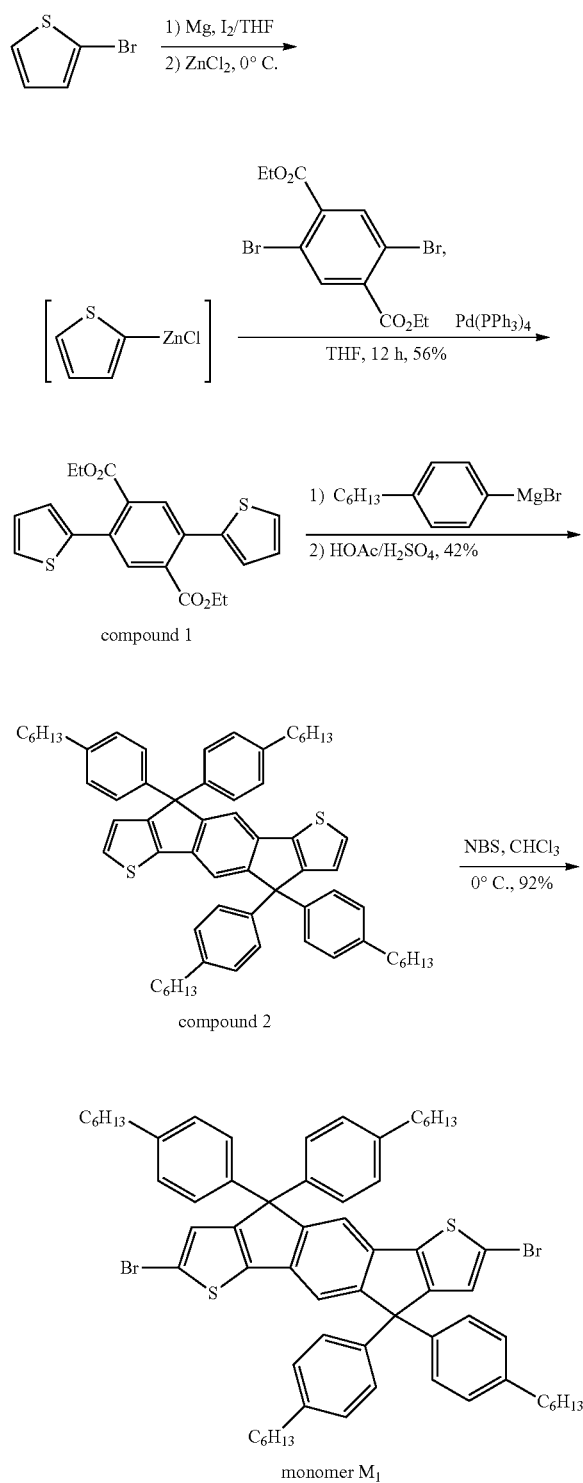

Monomer $M_2$:

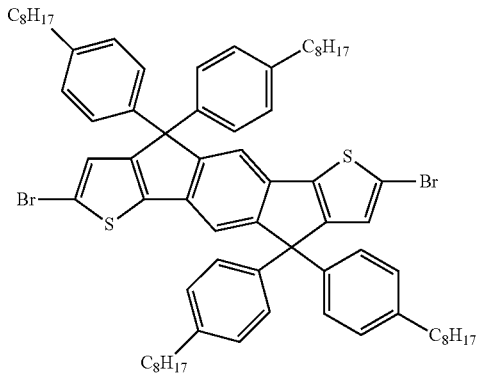

Monomer $M_2$ is prepared according to the preparation of monomer $M_1$, where "4-n-hexylphenylmagnesium bromide" of step ii) is replaced with "4-n-octylphenylmagnesium bromide";

Monomer $M_3$:

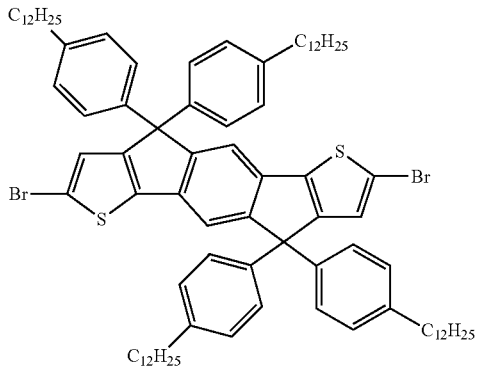

Monomer $M_3$ is prepared according to the preparation of monomer $M_1$, where "4-n-hexylphenylmagnesium bromide" of step ii) is replaced with "4-n-dodecylphenylmagnesium bromide".

Monomer $M_4$ is prepared according to the preparation of monomer $M_1$, where "4-n-hexylphenylmagnesium bromide" of step ii) is replaced with "4-n-eicosylphenylmagnesium bromide";

Other TPT derivatives are prepared according to the preparation of monomer $M_1$, where "4-n-hexylphenylmagnesium bromide" of step ii) is replaced with corresponding monomer, thus need not be described herein in detail.

Preparation of monomer $D_1$ will be illustrated below by taking the preparation of monomer $D_{1a}$: 2,5-bis(trimethylstannyl)thiophene as example:

Preparation of Monomer $D_{1a}$

Thiophene (8.4 g, 0.10 mol) and 60 mL of THF are mixed under the protection of argon, followed by addition of hexane solution of butyllithium (hexane solution of butyllithium is to dissolve butyllithium (73 ml, 0.21 mol, 2.88 M) in hexane solution), then heated to reflux, the reaction is held for 2 h. The heating apparatus is removed and trimethyltin chloride (41.9 g, 0.21 mol) is added at 15° C., the reaction is held with stirring for 12 h. After rotary evaporation to remove solvent, the reminders are subjected to distillation under reduced pressure at 0.1 mmHg, colorless liquid obtained at 220° C. is 2,5-bis(trimethylstannyl)thiophene, the yield is 53%. GC-Ms: m/z=412.

Monomer $D_{1b}$: 5,5'-bis(trimethylstannyl)-2,2'-dithiophene is prepared according to the preparation of monomer $D_{1a}$, where "thiophene" is replaced with "2, 2'-dithiophene", then the monomer $D_{1b}$ is obtained. The yield is 60%.

Monomer $D_{1c}$: 2,5-bis(trimethylstannyl)-3,4-ethylenedioxythiophene is prepared according to the preparation of monomer $D_{1a}$, where "thiophene" is replaced with "3,4-ethylenedioxythiophene", then the monomer $D_{1c}$ is obtained. The yield is 65%.

Preparation of Monomer $D_{1d}$

Monomer $D_{1d-1}$: preparation of monomer $D_{1d}$ will be illustrated by taking the preparation of (3,3-bis(octyloxymethyl)-3,4-dihydro-2H-thieno[3,4-b][1,4]dioxepine-6,8-diyl)bis(trimethylstannane) as example:

(3,3-bis(octyloxymethyl)-3,4-dihydro-2H-thieno[3,4-b][1,4]dioxepine-6,8-diyl)bis(trimethylstannane) is prepared according to the preparation of monomer $D_{1a}$, where "thiophene" is replaced with 3,3-bis(octyloxymethyl)-3,4-dihydro-2H-thieno[3,4-b][1,4]dioxepine-6,8-diyl".

The yield is 56%.

Monomer $D_{1d-2}$: preparation of monomer $D_{1d}$ will be illustrated by taking the preparation of (3,3-bis(hexyloxymethyl)-3,4-dihydro-2H-thieno[3,4-b][1,4]dioxepine-6,8-diyl)bis(trimethylstannane) as example:

(3,3-bis(hexyloxymethyl)-3,4-dihydro-2H-thieno[3,4-b][1,4]dioxepine-6,8-diyl)bis(trimethylstannane) is prepared according to the preparation of monomer $D_{1a}$, where "thiophene" is replaced with 3,3-bis(hexyloxymethyl)-3,4-dihydro-2H-thieno[3,4-b][1,4]dioxepine-6,8-diyl".

The yield is 54%.

Monomer $D_{1d-3}$: preparation of monomer $D_{1d}$ will be illustrated by taking the preparation of (3,3-bis(dodecyloxymethyl)-3,4-dihydro-2H-thieno[3,4-b][1,4]dioxepine-6,8-diyl)bis(trimethylstannane) as example.

(3,3-bis(dodecyloxymethyl)-3,4-dihydro-2H-thieno[3,4-b][1,4]dioxepine-6,8-diyl)bis(trimethylstannane) is prepared according to the preparation of monomer $D_{1a}$, where "thiophene" is replaced with 3,3-bis(dodecyloxymethyl)-3,4-dihydro-2H-thieno[3,4-b][1,4]dioxepine-6,8-diyl".

The yield is 75%.

Monomer $D_{1d-4}$: preparation of monomer $D_{1d}$ will be illustrated by taking the preparation of (3,3-bis(eicosyloxymethyl)-3,4-dihydro-2H-thieno[3,4-b][1,4]dioxepine-6,8-diyl)bis(trimethylstannane) as example.

(3,3-bis(eicosyloxymethyl)-3,4-dihydro-2H-thieno[3,4-b][1,4]dioxepine-6,8-diyl)bis(trimethylstannane) is prepared according to the preparation of monomer $D_{1a}$, where "thiophene" is replaced with 3,3-bis(eicosyloxymethyl)-3,4-dihydro-2H-thieno[3,4-b][1,4]dioxepine-6,8-diyl".

The yield is 75%.

Preparation of Monomer $D_{1e}$

Monomer $D_{1e-1}$: preparation of monomer $D_{1e}$ will be illustrated by taking the preparation of 3,4-di-n-octyl-2,5-bis(trimethylstannyl)thiophene as example.

3,4-di-n-octyl-2,5-bis(trimethylstannyl)thiophene is prepared according to the preparation of monomer $D_{1a}$, where "thiophene" is replaced with "3,4-di-n-octyl-thiophene". The yield is 58%.

Monomer $D_{1e-2}$: preparation of monomer $D_{1e}$ will be illustrated by taking the preparation of 3,4-di-n-hexyl-2,5-bis(trimethylstannyl)thiophene as example.

3,4-di-n-hexyl-2,5-bis(trimethylstannyl)thiophene is prepared according to the preparation of monomer $D_{1a}$, where "thiophene" is replaced with "3,4-di-n-hexyl-thiophene". The yield is 57%.

Monomer $D_{1e-3}$: preparation of monomer $D_{1e}$ will be illustrated by taking the preparation of 3,4-di-n-dodecyl-2,5-bis(trimethylstannyl)thiophene as example.

3,4-di-n-dodecyl-2,5-bis(trimethylstannyl)thiophene is prepared according to the preparation of monomer $D_{1a}$, where "thiophene" is replaced with "3,4-di-n-dodecyl-thiophene". The yield is 65%.

Monomer $D_{1e-3}$: preparation of monomer $D_{1e}$ will be illustrated by taking the preparation of 3,4-di-n-eicosyl-2,5-bis(trimethylstannyl)thiophene as example.

3,4-di-n-eicosyl-2,5-bis(trimethylstannyl)thiophene is prepared according to the preparation of monomer $D_{1a}$, where "thiophene" is replaced with "3,4-di-n-eicosyl-thiophene". The yield is 71%.

Preparation of Monomer $D_{1f}$

Monomer $D_{1f-1}$: preparation of monomer $D_{1f}$ will be illustrated by taking the preparation of 1,3-bis(trimethylstannyl)-5-n-octyl-thieno[3,4-c]pyrrole-4,6-dione as example:

1,3-bis(trimethylstannyl)-5-n-octyl-thieno[3,4-c]pyrrole-4,6-dione is prepared according to the preparation of monomer $D_{1a}$, where "thiophene" is replaced with 5-n-octyl-thieno[3,4-c]pyrrole-4,6-dione". The yield is 54%.

Monomer $D_{1f-2}$: preparation of monomer $D_{1f}$ will be illustrated by taking the preparation of 1,3-bis(trimethylstannyl)-5-n-hexyl-thieno[3,4-c]pyrrole-4,6-dione as example:

1,3-bis (trimethylstannyl)-5-n-hexyl-thieno[3,4-c]pyrrole-4,6-dione is prepared according to the preparation of monomer $D_{1a}$, where "thiophene" is replaced with 5-n-hexyl-thieno[3,4-c]pyrrole-4,6-dione". The yield is 59%.

Monomer $D_{1f-3}$: preparation of monomer $D_{1f}$ will be illustrated by taking the preparation of 1,3-bis(trimethylstannyl)-5-n-dodecyl-thieno[3,4-c]pyrrole-4,6-dione as example:

1,3-bis(trimethylstannyl)-5-n-dodecyl-thieno[3,4-c]pyrrole-4,6-dione is prepared according to the preparation of monomer $D_{1a}$, where "thiophene" is replaced with 5-n-dodecyl-thieno[3,4-c]pyrrole-4,6-dione". The yield is 75%.

Monomer $D_{1f-4}$: preparation of monomer $D_{1f}$ will be illustrated by taking the preparation of 1,3-bis(trimethylstannyl)-5-n-eicosyl-thieno[3,4-c]pyrrole-4,6-dione as example:

1,3-bis(trimethylstannyl)-5-n-eicosyl-thieno[3,4-c]pyrrole-4,6-dione is prepared according to the preparation of monomer $D_{1a}$, where "thiophene" is replaced with 5-n-eicosyl-thieno[3,4-c]pyrrole-4,6-dione". The yield is 59%.

Preparation of monomer $D_{2a}$ will be illustrated below by taking the preparation of monomer $D_{2a-1}$: 4,7-dibromo-2-n-octyl-1,2,3-benzotriazole as example.

Monomer D$_{2a-1}$: 4,7-dibromo-2-n-octyl-1,2,3-benzotriazole is prepared according to the method disclosed in Macromolecules 2006, 39, 3546.

2-n-octyl-benzotriazole (2.9 g, 12.6 mmol) and HBr solution (5.8 mol/L, 14.4 mL) are mixed, then react at 100° C. for 1 hour, liquid bromine (5.5 g, 34.6 mmol) is added slowly. The temperature is elevated to 135° C., the reaction is held with stirring for 12 h. When the reaction is finished, the reaction mixture is cooled down to room temperature, and saturated sodium bicarbonate is added, followed by extraction with trichloromethane, drying with anhydrous magnesium sulfate, rotary evaporation to remove solvent. The reminders are separated using silica gel chromatography column to obtain bright yellow oil liquid, that is 4,7-dibromo-2-n-octyl-benzotriazole. The yield is 75%.

HNMR (CDCl$_3$, 400 MHz) δ 7.43 (s, 2H), 4.78 (t, 2H), 2.15 (m, 2H), 1.40-1.25 (m, 10H), 0.87 (t, 3H).

Monomer D$_{2a-2}$: 4,7-dibromo-2-n-hexyl-benzotriazole is prepared according to the preparation of monomer D$_{2a-1}$, where "2-n-octyl-benzotriazole" is replaced with "2-n-hexyl-benzotriazole", then monomer D$_{2a-2}$ is obtained. The yield is 72%.

Monomer D$_{2a-3}$: 4,7-dibromo-2-n-dodecyl-benzotriazole is prepared according to the preparation of monomer D$_{2a-1}$, where "2-n-octyl-benzotriazole" is replaced with "2-n-dodecyl-benzotriazole", then monomer D$_{2a-3}$ is obtained. The yield is 71%.

Monomer D$_{2b}$: 4,8-dibromobenzo[1,2-c; 4,5-c']bis[1,2,5]thiadiazole is prepared according to the method disclosed in Org. Lett., 2010, 12, 3340.

Preparation of Monomer D$_{2c}$

Monomer D$_{2c-1}$: 4,7-dibromo-5,6-bis(n-octyloxy)benzothiadiazole is prepared according to the method disclosed in Macromolecules 2008, 41, 5559. The yield is 70%.

Monomer D$_{2c-2}$: 4,7-dibromo-5,6-bis(n-hexyloxy)benzothiadiazole is prepared according to the method disclosed in Macromolecules 2008, 41, 5559. The yield is 65%.

Monomer D$_{2c-3}$: 4,7-dibromo-5,6-bis(n-dodecyloxy)benzo-thiadiazole is prepared according to the method disclosed in Macromolecules 2008, 41, 5559. The yield is 66%.

Monomer D$_{2c-4}$: 4,7-dibromo-5,6-bis(n-eicosyloxy)benzo-thiadiazole is prepared according to the method disclosed in Macromolecules 2008, 41, 5559. The yield is 62%.

In the preparation method of monomer M, monomer D$_1$ and monomer D$_2$, the used raw material is all purchased on the market.

The embodiment of the present invention further provides use of the above photovoltaic polymer material in organic optoelectronic material, organic solar cell device, organic field effect transistor device, organic electroluminescence device, organic optical storage device and organic laser device.

Further description of the preparation method of the present invention will be illustrated below, which combined with embodiments.

Example 1

The photovoltaic polymer material P (TPT-6-T-BTz-8) of the embodiment of the present invention has the following formula:

Preparation method of the photovoltaic polymer material P (TPT-6-T-BTz-8) of the embodiment of the present invention comprises the follows steps:

Under the protection of nitrogen, adding monomer M$_1$, monomer D$_{1a}$: 2,5-bis(trimethylstannyl)thiophene and monomer D$_{2a-1}$: 4,7-dibromo-2-n-octyl-1,2,3-benzotriazole into tris(dibenzylideneacetone)dipalladium (5.5 mg, 0.006 mmol), tris(o-methylphenyl)phosphine (14.6 mg, 0.048 mmol) and chlorobenzene (5 mL) according to the molar ratio that monomer M$_1$: monomer D$_{1a}$: monomer D$_{2a-1}$ is 1:2:1, mixing, reacting in microwave reactor for 30 min, obtaining dark solution containing photovoltaic polymer material P (TPT-6-T-BTz-8); pouring the dark solution into methanol (1 L), filtrating to obtain black precipitates, extracting from raw product in Soxhlet extractor with methanol, acetone, n-hexane for 24 h, then collecting soluble parts with chloroform, finally, carrying out chromatography with methanol, centrifuging and collecting solid, vacuum drying to obtain purified photovoltaic polymer material. The yield is 76%. Molecular weight (GPC, THF, R. I): M$_n$=38600, M$_w$/M$_n$=2.1).

Example 2

The photovoltaic polymer material P (TPT-8-T-BTz-6) of the embodiment of the present invention has the following formula:

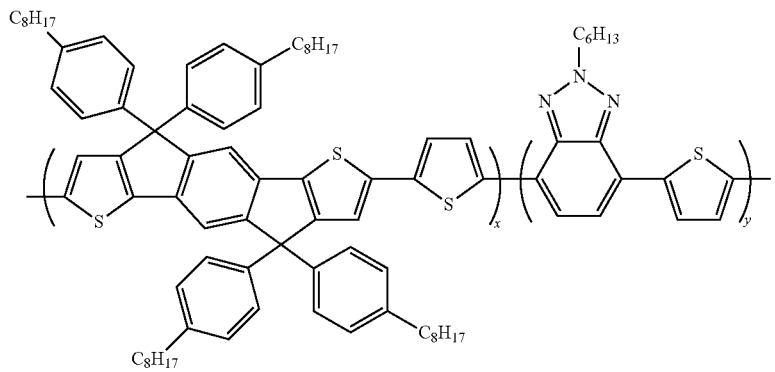

Preparation method of the photovoltaic polymer material P (TPT-8-T-BTz-6) of the embodiment of the present invention, referring to Example 1, where molar ratio of monomers that monomer $M_2$: monomer $D_{1a}$: monomer $D_{2a-2}$ is 1:3:1, tris(dibenzylideneacetone)dipalladium: tris(o-methylphenyl)phosphine is 1:6.

The yield is 75%. Molecular weight (GPC, THF, R. I): $M_n=37600$, $M_w/M_n=2.3$).

Example 3

The photovoltaic polymer material P (TPT-12-T-BTz-12) of the embodiment of the present invention has the following formula:

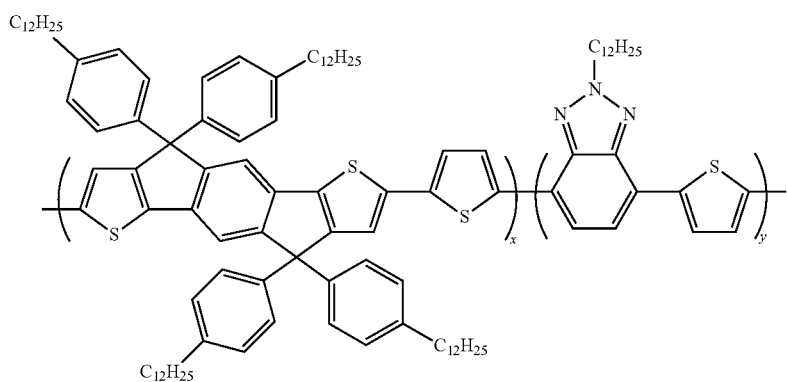

Preparation method of the photovoltaic polymer material P (TPT-12-T-BTz-12) of the embodiment of the present invention, referring to Example 1, where molar ratio of monomers that monomer $M_3$: monomer $D_{1a}$: monomer $D_{2a-3}$ is 1:6:2, tris(dibenzylideneacetone)dipalladium: tris(o-methylphenyl)phosphine is 1:3.

The yield is 85%. Molecular weight (GPC, THF, R. I): $M_n=48500$, $M_w/M_n=1.1$).

Example 4

The photovoltaic polymer material P (TPT-6-DT-BTz-8) of the embodiment of the present invention has the following formula:

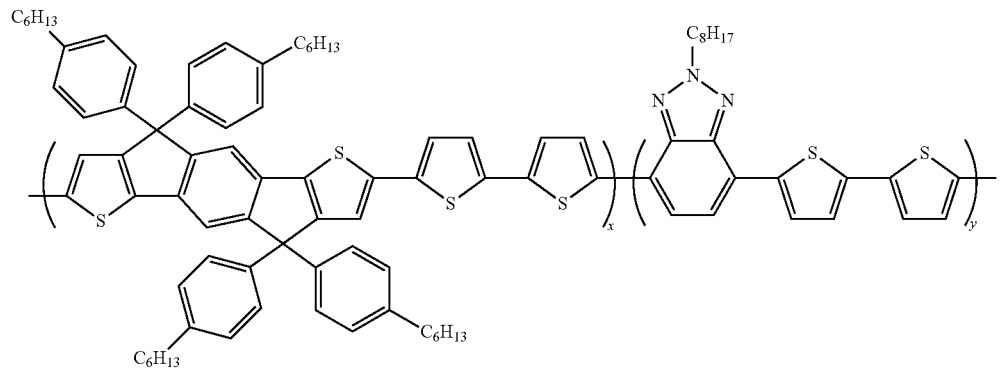

Preparation method of the photovoltaic polymer material P (TPT-6-DT-BTz-8) of the embodiment of the present invention, referring to Example 1, where molar ratio of monomers that monomer $M_1$: monomer $D_{1b}$: monomer $D_{2a-1}$ is 1:6:2, tris(dibenzylideneacetone)dipalladium: tris(o-methylphenyl)phosphine is 1:5 by mole.

The yield is 69%. Molecular weight (GPC, THF, R. I): $M_n=36700$, $M_w/M_n=2.2$).

Example 5

The photovoltaic polymer material P (TPT-6-EDOT-BTz-8) of the embodiment of the present invention has the following formula:

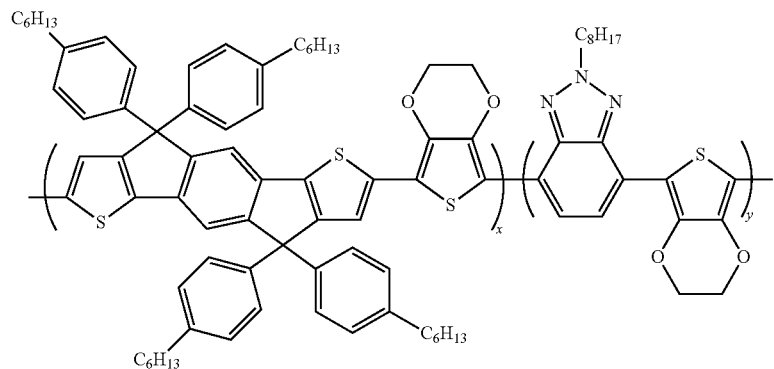

Preparation method of the photovoltaic polymer material P (TPT-6-EDOT-BTz-8) of the embodiment of the present invention, referring to Example 1, where molar ratio of monomers that monomer $M_1$: monomer $D_{1c}$: monomer $D_{2a-1}$ is 1:5:2, molar ratio that tris(dibenzylideneacetone)dipalladium: tris(o-methylphenyl)phosphine is 1:5.

The yield is 71%. Molecular weight (GPC, THF, R. I): $M_n=37900$, $M_w/M_n=2.1$).

Example 6

The photovoltaic polymer material P (TPT-6-PDOT-8-BTz-8) of the embodiment of the present invention has the following formula:

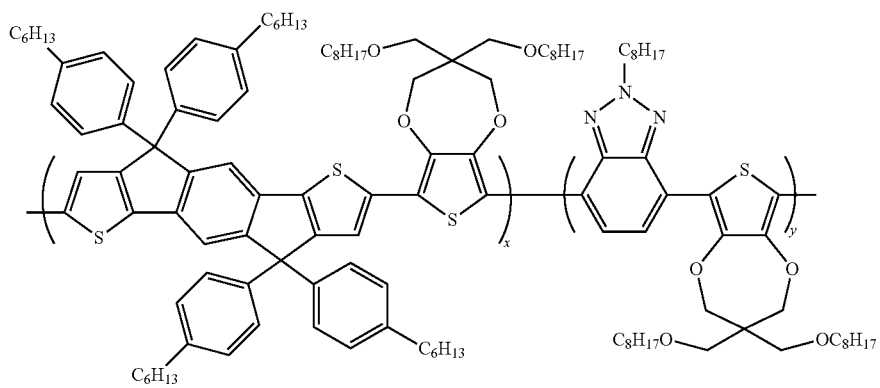

Preparation method of the photovoltaic polymer material P (TPT-6-PDOT-8-BTz-8) of the embodiment of the present invention, referring to Example 1, where molar ratio of monomers that monomer $M_1$: monomer $D_{1d-1}$: monomer $D_{2a-1}$ is 1:4:2, molar ratio that tris(dibenzylideneacetone)dipalladium: tris(o-methylphenyl)phosphine is 1:4.

The yield is 65%. Molecular weight (GPC, THF, R. I): $M_n$=32400, $M_w/M_n$=2.4).

Example 7

P (TPT-6-DAT-8-BTz-8) of the embodiment of the present invention has the following formula:

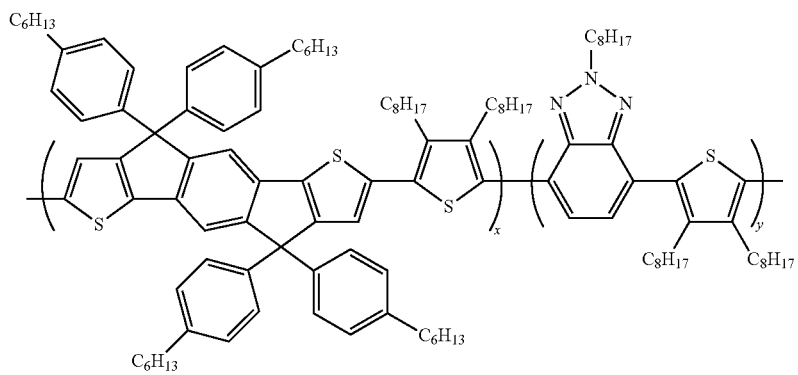

Preparation method of the photovoltaic polymer material P (TPT-6-DAT-8-BTz-8) of the embodiment of the present invention, referring to Example 1, where molar ratio of monomers that monomer $M_1$: monomer $D_{1e-1}$: monomer $D_{2a-1}$ is 1:4:2.5, molar ratio that tris(dibenzylideneacetone)dipalladium: tris(o-methylphenyl)phosphine is 1:4.

The yield is 68%. Molecular weight (GPC, THF, R. I): $M_n$=35600, $M_w/M_n$=2.3).

Example 8

The photovoltaic polymer material P (TPT-6-TPD-8-BTz-8) of the embodiment of the present invention has the following formula:

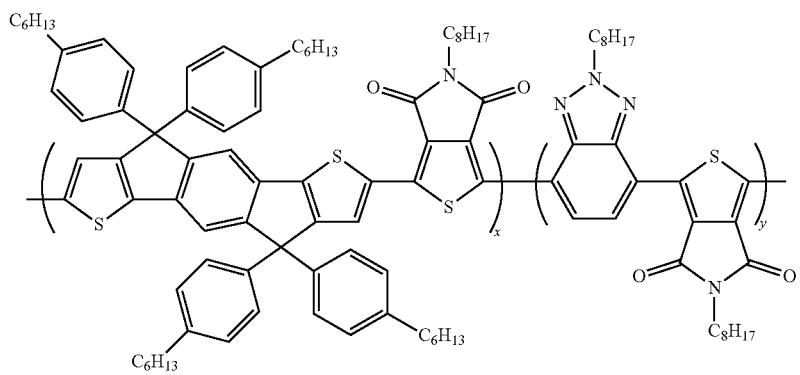

Preparation method of the photovoltaic polymer material P (TPT-6-TPD-8-BTz-8) of the embodiment of the present invention, referring to Example 1, where molar ratio of monomers that monomer $M_1$: monomer $D_{1f\text{-}1}$: monomer $D_{2a\text{-}1}$ is 1:4:2, molar ratio that tris(dibenzylideneacetone)dipalladium: tris(o-methylphenyl)phosphine is 1:3. The yield is 52%. Molecular weight (GPC, THF, R. I): $M_n$=29100, $M_w/M_n$=2.1).

Example 9

The photovoltaic polymer material P (TPT-6-T-BBT) of the embodiment of the present invention has the following formula:

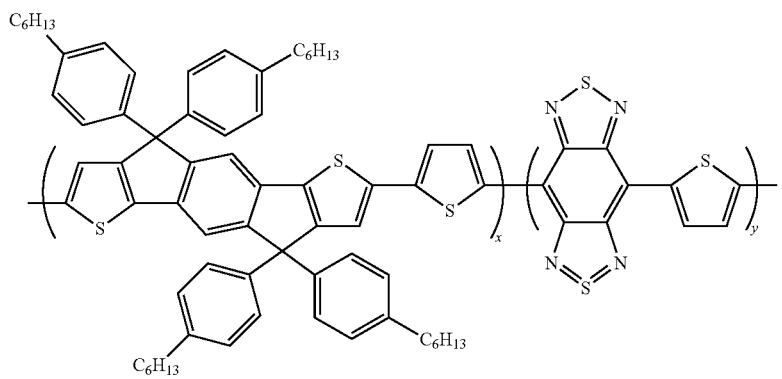

Preparation method of the photovoltaic polymer material P (TPT-6-T-BBT) of the embodiment of the present invention, referring to Example 1, where molar ratio of monomers that monomer $M_1$: monomer $D_{1a}$: monomer $D_{2b}$ is 1:3:2, molar ratio that tris(dibenzylideneacetone)dipalladium: tris(o-methylphenyl)phosphine is 1:3.

The yield is 79%. Molecular weight (GPC, THF, R. I): $M_n$=38700, $M_w/M_n$=2.1).

Example 10

The photovoltaic polymer material P (TPT-6-DT-BBT) of the embodiment of the present invention has the following formula:

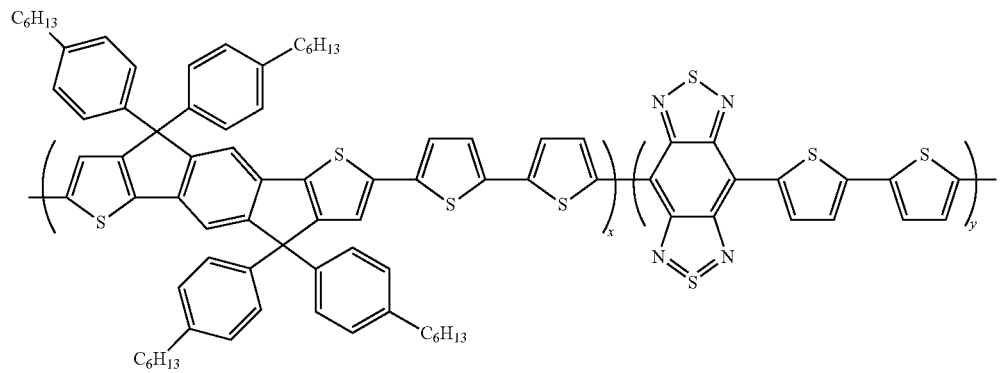

Preparation method of the photovoltaic polymer material P (TPT-6-DT-BBT) of the embodiment of the present invention, referring to Example 1, where molar ratio of monomers that monomer $M_1$: monomer $D_{1b}$: monomer $D_{2b}$ is 1:2:1, molar ratio that tris(dibenzylideneacetone)dipalladium: tris (o-methylphenyl)phosphine is 1:8.

The yield is 70%. Molecular weight (GPC, THF, R. I): $M_n=36200$, $M_w/M_n=2.2$).

Example 11

The photovoltaic polymer material P (TPT-6-EDOT-BBT) of the embodiment of the present invention has the following formula:

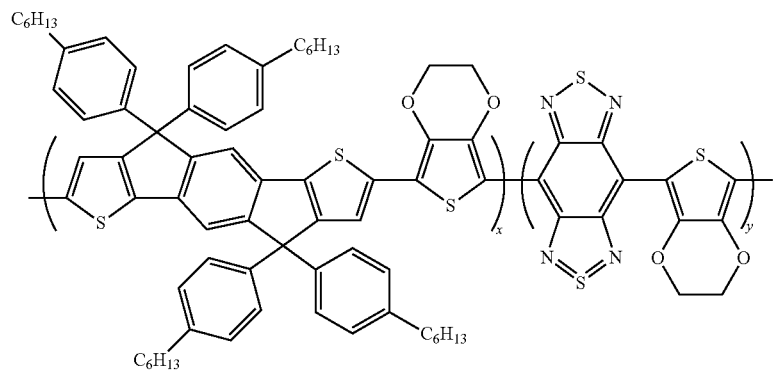

Preparation method of the photovoltaic polymer material P (TPT-6-EDOT-BBT) of the embodiment of the present invention, referring to Example 1, where molar ratio of monomers that monomer $M_1$: monomer $D_{1c}$: monomer $D_{2b}$ is 1:2:1, molar ratio that tris(dibenzylideneacetone)dipalladium: tris (o-methylphenyl)phosphine is 1:8.

The yield is 75%. Molecular weight (GPC, THF, R. I): $M_n=34600$, $M_w/M_n=2.4$).

Example 12

The photovoltaic polymer material P (TPT-20-PDOT20-BBT) of the embodiment of the present invention has the following formula:

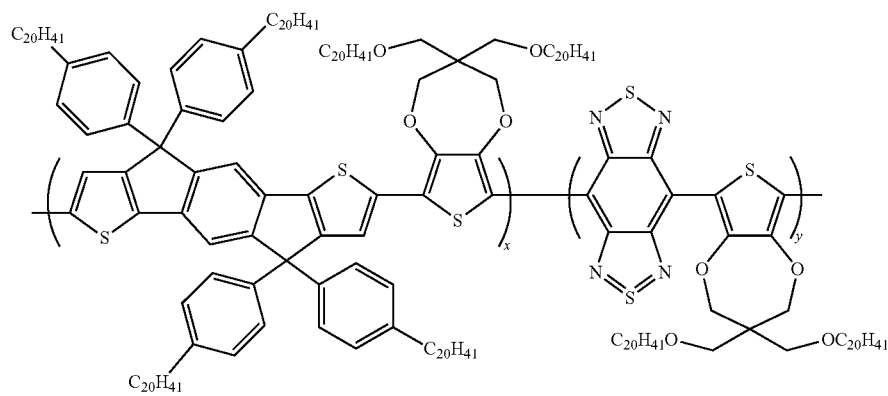

Preparation method of the photovoltaic polymer material P (TPT-20-PDOT20-BBT) of the embodiment of the present invention, referring to Example 1, where molar ratio of monomers that monomer $M_4$: monomer $D_{1d-4}$: monomer $D_{2b}$ is 1:2:1, molar ratio that tris(dibenzylideneacetone)dipalladium: tris(o-methylphenyl)phosphine is 1:8.

The yield is 62%. Molecular weight (GPC, THF, R. I): $M_n=28800$, $M_w/M_n=2.5$).

Example 13

The photovoltaic polymer material P (TPT-6-DAT-20-BBT) of the embodiment of the present invention has the following formula:

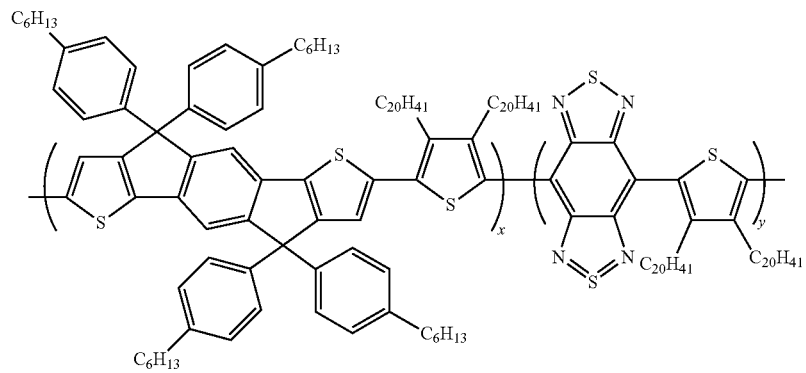

Preparation method of the photovoltaic polymer material P (TPT-6-DAT-20-BBT) of the embodiment of the present invention, referring to Example 1, where molar ratio of monomers that monomer $M_1$: monomer $D_{1e-4}$: monomer $D_{2b}$ is 1:2:1, molar ratio that tris(dibenzylideneacetone)dipalladium: tris(o-methylphenyl)phosphine is 1:8.

The yield is 64%. Molecular weight (GPC, THF, R. I): $M_n=31600$, $M_w/M_n=1.9$).

Example 14

The photovoltaic polymer material P (TPT-6-TPD-20-BTz) of the embodiment of the present invention has the following formula:

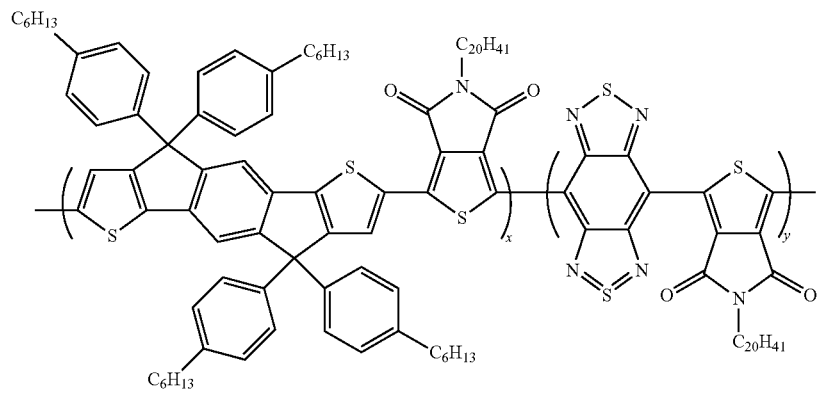

Preparation method of the photovoltaic polymer material P (TPT-6-TPD-20-BTz) of the embodiment of the present invention, referring to Example 1, where molar ratio of monomers that monomer $M_1$: monomer $D_{1f-4}$: monomer $D_{2b}$ is 1:2:1, molar ratio that tris(dibenzylideneacetone)dipalladium: tris(o-methylphenyl)phosphine is 1:8.

The yield is 59%. Molecular weight (GPC, THF, R. I): $M_n$=30000, $M_w/M_n$=2.2).

Example 15

The photovoltaic polymer material P (TPT-6-T-DAOBT-8) of the embodiment of the present invention has the following formula:

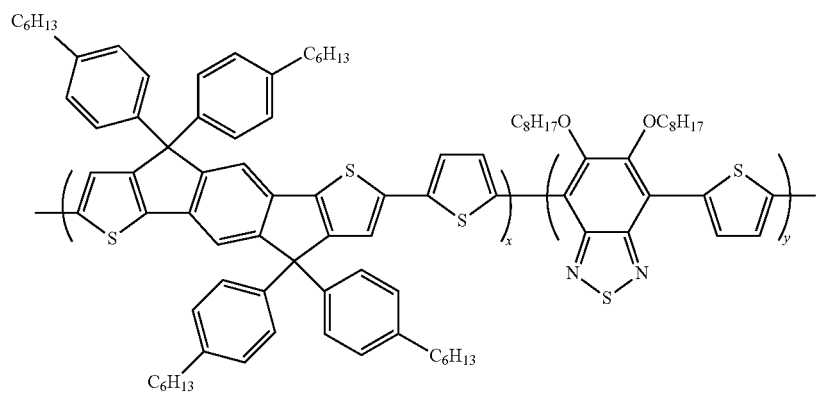

Preparation method of the photovoltaic polymer material P (TPT-6-T-DAOBT-8) of the embodiment of the present invention, referring to Example 1, where molar ratio of monomers that monomer $M_1$: monomer $D_{1a}$: monomer $D_{2c-1}$ is 1:2:1, molar ratio that tris(dibenzylideneacetone)dipalladium: tris(o-methylphenyl)phosphine is 1:8.

The yield is 82%. Molecular weight (GPC, THF, R. I): $M_n$=39200, $M_w/M_n$=1.9).

Example 16

The photovoltaic polymer material P (TPT-6-DT-DAOBT-8) of the embodiment of the present invention has the following formula:

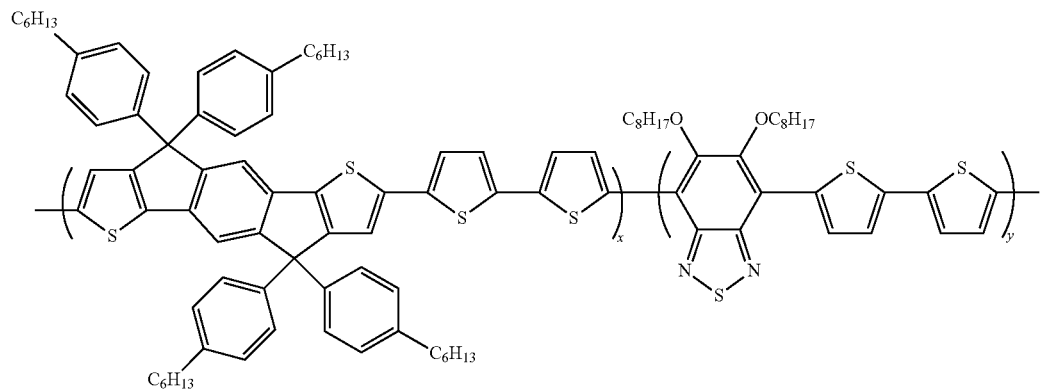

Preparation method of the photovoltaic polymer material P (TPT-6-DT-DAOBT-8) of the embodiment of the present invention, referring to Example 1, where molar ratio of monomers that monomer $M_1$: monomer $D_{1b}$: monomer $D_{2c-1}$ is 1:2:1, molar ratio that tris(dibenzylideneacetone)dipalladium: tris(o-methylphenyl)phosphine is 1:8.

The yield is 57%. Molecular weight (GPC, THF, R. I): $M_n$=34700, $M_w/M_n$=2.1).

Example 17

The photovoltaic polymer material P (TPT-EDOT-DAOBT-8) of the embodiment of the present invention has the following formula:

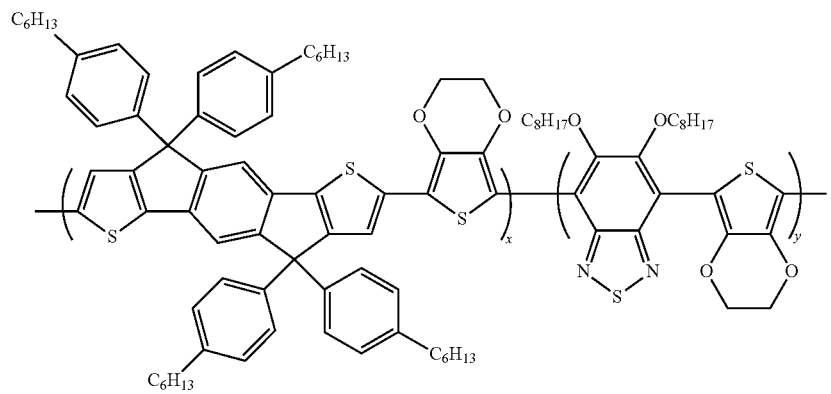

Preparation method of the photovoltaic polymer material P (TPT-EDOT-DAOBT-8) of the embodiment of the present invention, referring to Example 1, where molar ratio of monomers that monomer $M_1$: monomer $D_{1c}$: monomer $D_{2c-1}$ is 1:2:1, molar ratio that tris(dibenzylideneacetone)dipalladium: tris(o-methylphenyl)phosphine is 1:8.

The yield is 74%. Molecular weight (GPC, THF, R. I): $M_n$=35600, $M_w/M_n$=2.1).

Example 18

The photovoltaic polymer material P (TPT-6-PDOT-6-DAOBT-6) of the embodiment of the present invention has the following formula:

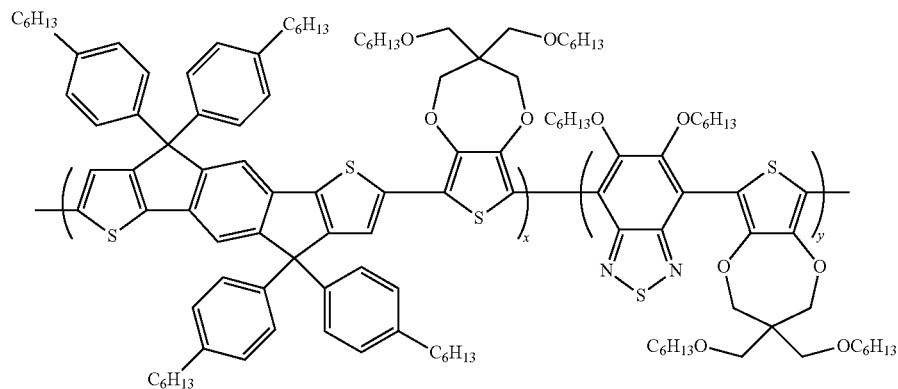

Preparation method of the photovoltaic polymer material P (TPT-6-PDOT-6-DAOBT-6) of the embodiment of the present invention, referring to Example 1, where molar ratio of monomers that monomer $M_1$: monomer $D_{1d\text{-}2}$: monomer $D_{2c\text{-}2}$ is 1:2:1, molar ratio that tris(dibenzylideneacetone)dipalladium: tris(o-methylphenyl)phosphine is 1:8.

The yield is 77%. Molecular weight (GPC, THF, R. I): $M_n$=31800, $M_w/M_n$=2.0).

Example 19

The photovoltaic polymer material P (TPT-12-PDOT-12-DAOB T-12) of the embodiment of the present invention has the following formula:

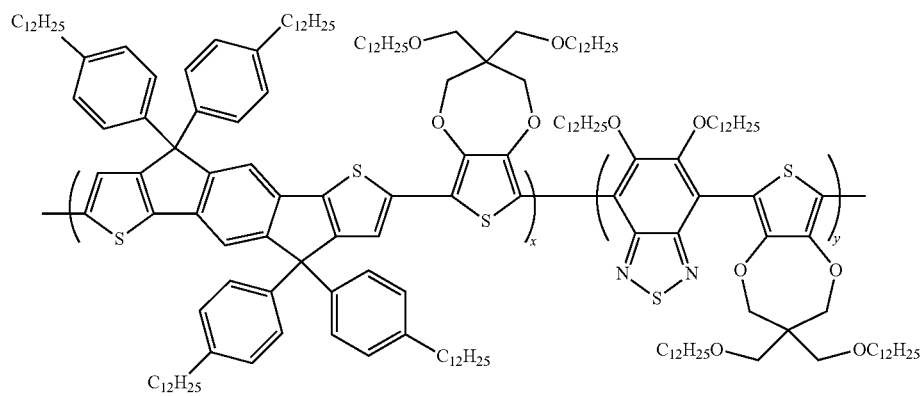

Preparation method of the photovoltaic polymer material P (TPT-12-PDOT-12-DAOBT-12) of the embodiment of the present invention, referring to Example 1, where molar ratio of monomers that monomer $M_3$: monomer $D_{1d\text{-}3}$: monomer $D_{2c\text{-}3}$ is 1:2:1, molar ratio that tris(dibenzylideneacetone)dipalladium: tris(o-methylphenyl)phosphine is 1:8.

The yield is 77%. Molecular weight (GPC, THF, R. I): $M_n$=31800, $M_w/M_n$=2.0).

Example 20

The photovoltaic polymer material P (TPT-6-DAT-8-DAOBT-8) of the embodiment of the present invention has the following formula:

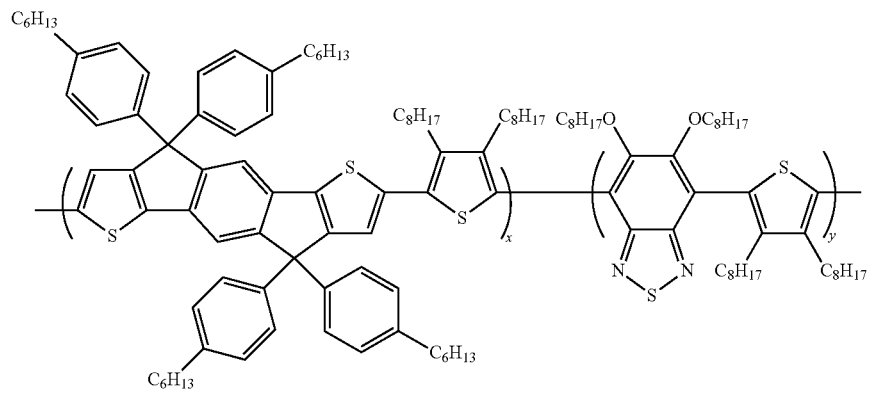

Preparation method of the photovoltaic polymer material P (TPT-6-DAT-8-DAOBT-8) of the embodiment of the present invention, referring to Example 1, where molar ratio of monomers that monomer $M_1$: monomer $D_{1e-1}$: monomer $D_{2c-1}$ is 1:2:1, molar ratio that tris(dibenzylideneacetone)dipalladium: tris(o-methylphenyl)phosphine is 1:8.

The yield is 71%. Molecular weight (GPC, THF, R. I): $M_n$=30800, $M_w/M_n$=2.1).

Example 20

The photovoltaic polymer material P (TPT-12-DAT-12-DAOBT-12) of the embodiment of the present invention has the following formula:

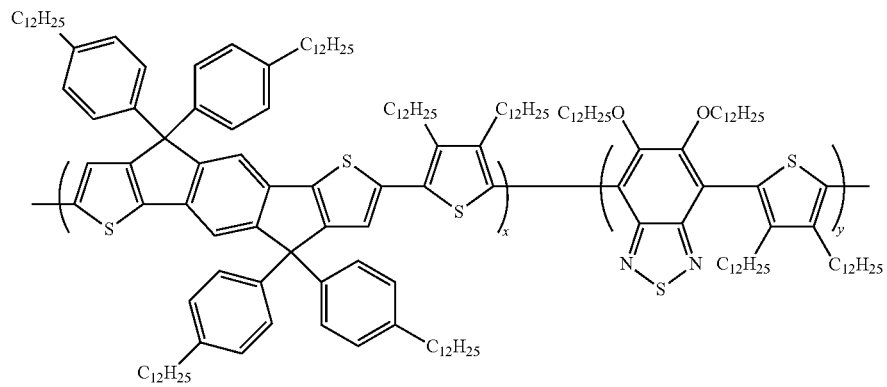

Preparation method of the photovoltaic polymer material P (TPT-12-DAT-12-DAOBT-12) of the embodiment of the present invention, referring to Example 1, where molar ratio of monomers that monomer $M_3$: monomer $D_{1e-3}$: monomer $D_{2c-3}$ is 1:2:1, molar ratio that tris(dibenzylideneacetone)dipalladium: tris(o-methylphenyl)phosphine is 1:8.

The yield is 80%. Molecular weight (GPC, THF, R. I): $M_n$=35600, $M_w/M_n$=2.3).

Example 21

The photovoltaic polymer material P (TPT-6-TPD-8-DAOBT-8) of the embodiment of the present invention has the following formula:

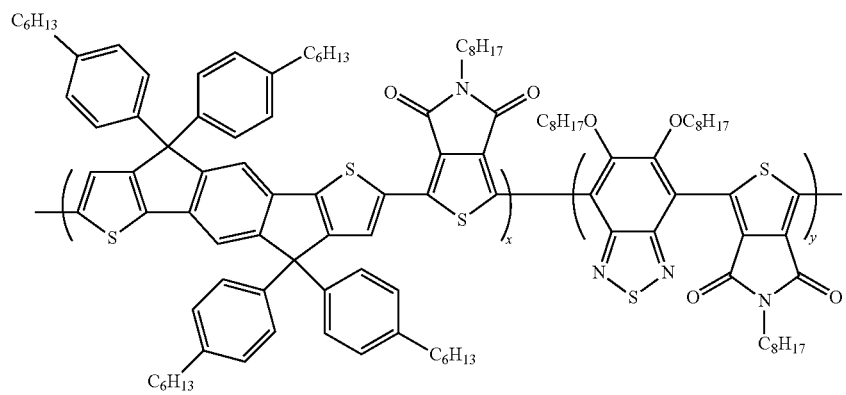

Preparation method of the photovoltaic polymer material P (TPT-6-DAT-8-DAOBT-8) of the embodiment of the present invention, referring to Example 1, where molar ratio of monomers that monomer $M_1$: monomer $D_{1f\text{-}1}$: monomer $D_{2c\text{-}1}$ is 1:2:1, molar ratio that tris(dibenzylideneacetone)dipalladium: tris(o-methylphenyl)phosphine is 1:8.

The yield is 71%. Molecular weight (GPC, THF, R. I): $M_n$=30800, $M_w/M_n$=2.1).

Example 22

The photovoltaic polymer material P (TPT-8-TPD-12-DAOBT-12) of the embodiment of the present invention has the following formula:

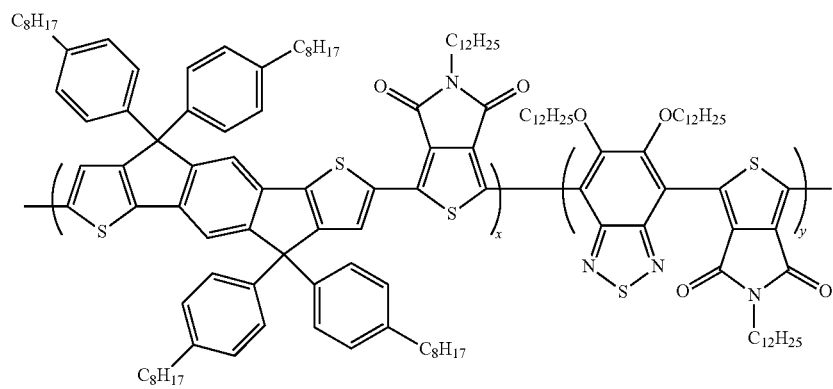

Preparation method of the photovoltaic polymer material P (TPT-6-DAT-8-DAOBT-8) of the embodiment of the present invention, referring to Example 1, where molar ratio of monomers that monomer $M_2$: monomer $D_{1f\text{-}3}$: monomer $D_{2c\text{-}3}$ is 1:2:1, molar ratio that tris(dibenzylideneacetone)dipalladium: tris(o-methylphenyl)phosphine is 1:8.

The yield is 67%. Molecular weight (GPC, THF, R. I): $M_n$=30100, $M_w/M_n$=2.3).

Application Example

Figure 3:
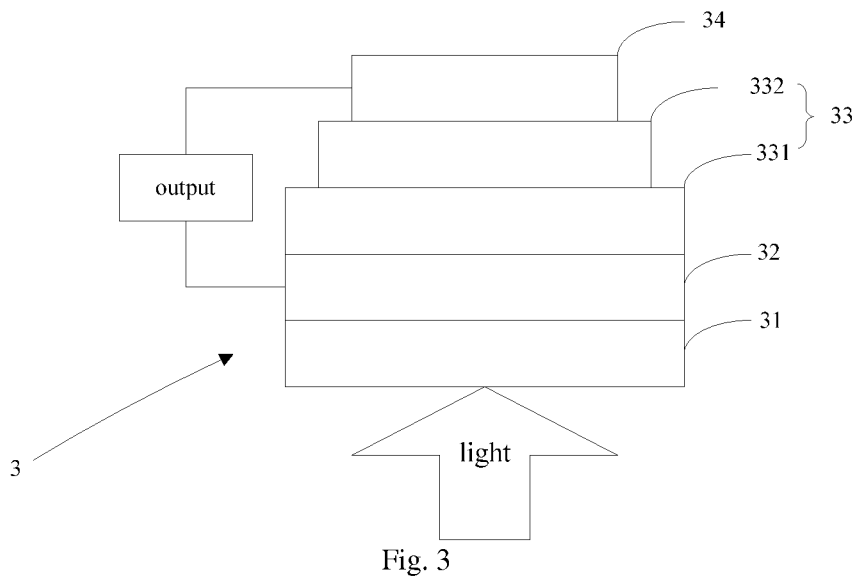
FIG. 3 is structure chart of solar cell device of the photovoltaic polymer material of the embodiment of the present invention.

FIG. 3 shows structure of photovoltaic polymer material solar cell device having the photovoltaic polymer material of Example 1 of the present invention served as active layer, including structures of: glass substrate 31, transparent anode 32, functional layer 33 comprising auxiliary layer 331 and active layer 332, cathode 34. Herein, the glass substrate 31 can include various glass, there is no limits to material but not barrier to sunlight. Transparent anode 32 can be but not limited to indium tin oxide having square resistance of 10~20Ω/□, that is, ITO. Auxiliary layer 331 can be but not limited to PEDOT:PSS, where PEDOT is poly(3,3-ethylenedioxythiophene), PSS is poly(styrene sulfonate). Active layer 332 is photovoltaic polymer material of the embodiment of the present invention. In the organic solar cell device 3 of the embodiment of the present invention, glass substrate 31/transparent anode 32 is an integral unit, which is also named as ITO glass and can be purchased on the market. Wherein, material of active layer comprises photovoltaic polymer material of Example 1 of the present invention served as electron donor material and [6,6]-phenyl C61 butyric acid methyl ester (abbr. PCBM) served as electron acceptor material that together make up the functional layer of organic electroluminescence device. Photovoltaic polymer material of the present invention served as electron donor material and PCBM served as electron acceptor material is prepared by spin coating technique, metal aluminium electrode is prepared by vacuum evaporation technique, then obtaining photovoltaic polymer material solar cell device.

While the present invention has been described with reference to particular embodiments, it will be understood that the embodiments are illustrative and that the invention scope is not so limited. Alternative embodiments of the present invention will become apparent to those having ordinary skill in the art to which the present invention pertains. Such alternate embodiments are considered to be encompassed within the spirit and scope of the present invention. Accordingly, the scope of the present invention is described by the appended claims and is supported by the foregoing description.

What is claimed is:

1. A photovoltaic polymer material, having the following structural formula:

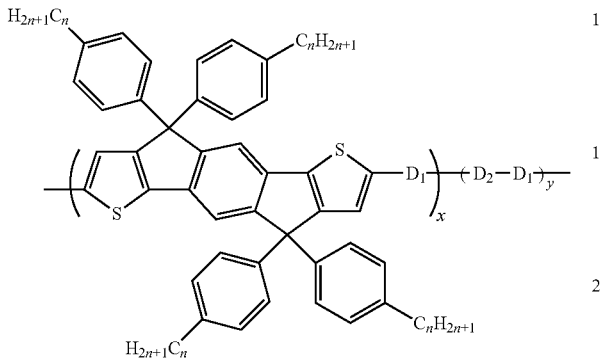

wherein $D_1$ is one selected from the following structures:

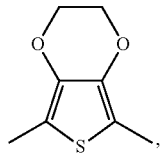  $D_{1c}$

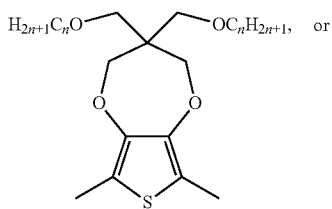  $D_{1d}$, or

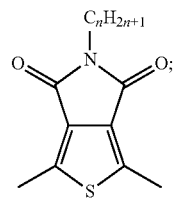  $D_{1f}$ $D_2$ is one selected from the following structures:

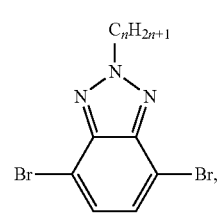  $D_{2a}$

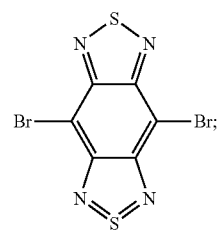  $D_{2b}$ n is an arbitrary natural number from 6 to 20, x is an arbitrary natural number from 1 to 50, y is an arbitrary natural number from 1 to 50, 2≤x+y≤100.

2. The photovoltaic polymer material as claimed in claim 1, wherein said n is an arbitrary natural number from 6 to 12.

3. The photovoltaic polymer material as claimed in claim 1, wherein said x is an arbitrary natural number from 2 to 40, said y is an arbitrary natural number from 2 to 40, 4≤x+y≤80.

4. The photovoltaic polymer material as claimed in claim 1, wherein number-average molar mass of said photovoltaic polymer material is in the range of from 29100 to 40000, molecular weight distribution is in the range of from 1.9 to 2.5.

* * * * *